United States Patent
Delbue et al.

(10) Patent No.: US 9,026,402 B2
(45) Date of Patent: May 5, 2015

(54) METHOD AND APPARATUS FOR SYNCHRONIZATION OF TEST AND MEASUREMENT APPARATUSES

(75) Inventors: Roger Delbue, Monroe, NY (US); Asres Seyoum, Hackensack, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 1146 days.

(21) Appl. No.: 12/971,276

(22) Filed: Dec. 17, 2010

(65) Prior Publication Data

US 2011/0191066 A1    Aug. 4, 2011

Related U.S. Application Data

(60) Provisional application No. 61/299,389, filed on Jan. 29, 2010.

(51) Int. Cl.
*H03F 1/26* (2006.01)
*G06F 15/00* (2006.01)
*H03L 7/00* (2006.01)

(52) U.S. Cl.
CPC . *G06F 15/00* (2013.01); *H03L 7/00* (2013.01)

(58) Field of Classification Search
None
See application file for complete search history.

(56) References Cited

U.S. PATENT DOCUMENTS

| | | | | |
|---|---|---|---|---|
| 4,390,837 A | * | 6/1983 | Hotvedt | 324/754.03 |
| 5,252,977 A | * | 10/1993 | Lueker et al. | 341/182 |
| 6,832,174 B2 | | 12/2004 | Tran et al. | |
| 7,152,006 B2 | | 12/2006 | Dobyns | |
| 7,398,175 B2 | | 7/2008 | Tran et al. | |

* cited by examiner

*Primary Examiner* — Aditya Bhat
(74) *Attorney, Agent, or Firm* — Gordon Kessler

(57) ABSTRACT

A synchronization apparatus and method for synchronizing a plurality of test and measurement apparatuses or signal generators are provided. A trigger selector is provided or for selecting from a plurality of triggers to be provided to the plurality of test and measurement apparatuses. A trigger enabled input is also provided for receiving a trigger enabled signal from each of the plurality of test and measurement apparatuses and a synchronizing block is provided for generating a single synchronized time stamp signal with the selected trigger and the trigger enabled inputs. A plurality of trigger outputs are also provided for providing the time stamp signal to a trigger input of each of the plurality of test and measurement apparatuses.

16 Claims, 5 Drawing Sheets

METHOD AND APPARATUS FOR SYNCHRONIZATION OF TEST AND MEASUREMENT APPARATUSES

CROSS REFERENCE TO RELATED APPLICATIONS

This application claims the benefit under 35 USC 119 of U.S. Provisional Patent Application Ser. No. 61/299,389 filed Jan. 29, 2010, titled "Method and Apparatus for Synchronization of Test and Measurement Apparatuses", the contents thereof being incorporated herein by reference.

FIELD OF THE INVENTION

This invention is related generally to a method and apparatus for synchronizing two or more test and measurement apparatuses or signal generators. More particularly, the invention is related to a method and apparatus for synchronizing two or more oscilloscopes or signal generators.

BACKGROUND OF THE INVENTION

Test and measurement apparatuses in general, and oscilloscopes in particular, allow a user to view certain aspects of an electronic or other signal. In the case of a traditional digital oscilloscope, the apparatus allows the user to view an electronic signal presented to an input of the oscilloscope. Each oscilloscope is provided with a number of input channels for receiving signals thereon. Furthermore, each oscilloscope is provided with one or more trigger options in order to allow for the indication of starting and stopping the recordation of data. Many oscilloscopes allow for an internally generated trigger, or for an externally provided trigger to be utilized.

While performing a number of tests or the like, a user may wish to view, compare, or test a plurality of signals at one time. While this is what an oscilloscope is designed to do, it may be the case that the user wishes to acquire more signals than there are available inputs in a particular oscilloscope. Traditionally, the user has not been able to do so, and must resort to acquiring some of the signal, storing them, and then acquiring other of the signals. This method, however, is unacceptable for a number of reasons in that it does not allow the viewing of a large number of simultaneously generated signals.

Therefore it would be beneficial to provide an improved method and apparatus that overcomes the drawbacks of the prior art.

Still other objects and advantages of the invention will in part be obvious and will in part be apparent from the specification and the drawings.

SUMMARY OF THE INVENTION

Therefore, in accordance with the invention, a test and measurement apparatus is provided that allows for the synchronization of a signal in a plurality of test and measurement apparatuses, and in particular a plurality of oscilloscopes or signal generators. While an initial solution to this problem may appear trivial, high speed signal introduce multiple additional factors that render the simple solution inadequate. Looking first at FIG. 1, it may be possible to connect an output from a Phase Locked Loop (PLL) clock generator 110 in a first master oscilloscope to an input to a similar PLL clock generator 120 in a second slave oscilloscope, thus synchronizing the internal clocks therebetween. Thus, any trigger generated may then be shared between the two oscilloscopes and applied to the input signals accordingly.

The inventor of the present invention, however, has recognized that the two PLL generated clocks may drift with respect to each other as the frequency of these clocks would not be phase locked. Over time, any waveforms acquired utilizing these two clocks would not be synchronized in time. Such errors may be particularly detrimental with very high speed signals as even small amounts of drift between the clocks may cause any acquired waveforms to be non-synchronized in time.

Therefore, in accordance with the invention, a method and apparatus are provided that provide for the synchronization of oscilloscopes by providing a common trigger thereto. By using a common signal to stop the acquisition in both oscilloscopes at the same time, a time stamp is defined where the same signal has triggered both oscilloscopes. This allows resolving any wander of the PLLs in the master and slave oscilloscopes to synchronize the signals after acquisition. Embodiments of the invention may similarly be applied to two or more oscilloscopes.

The embodiments of the invention may further be applied to synchronization of two or more signal generators.

The invention, accordingly comprises the features of construction, combination of elements, and arrangement of parts which will be exemplified in the construction hereinafter set forth, and the oscilloscope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
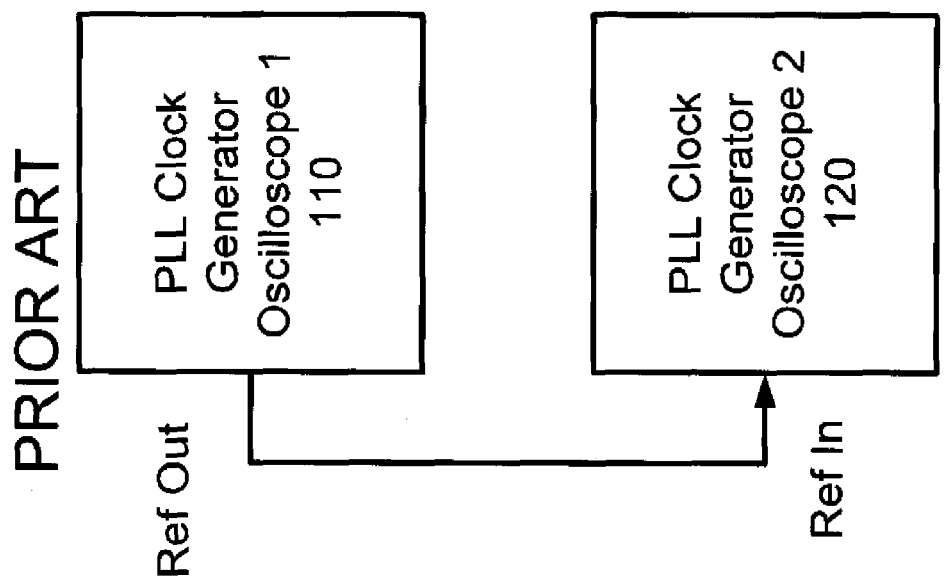
FIG. 1 is a block diagram depicting an inadequate prior art method for attempting to synchronize two test and measurement apparatuses.
Figure 2:
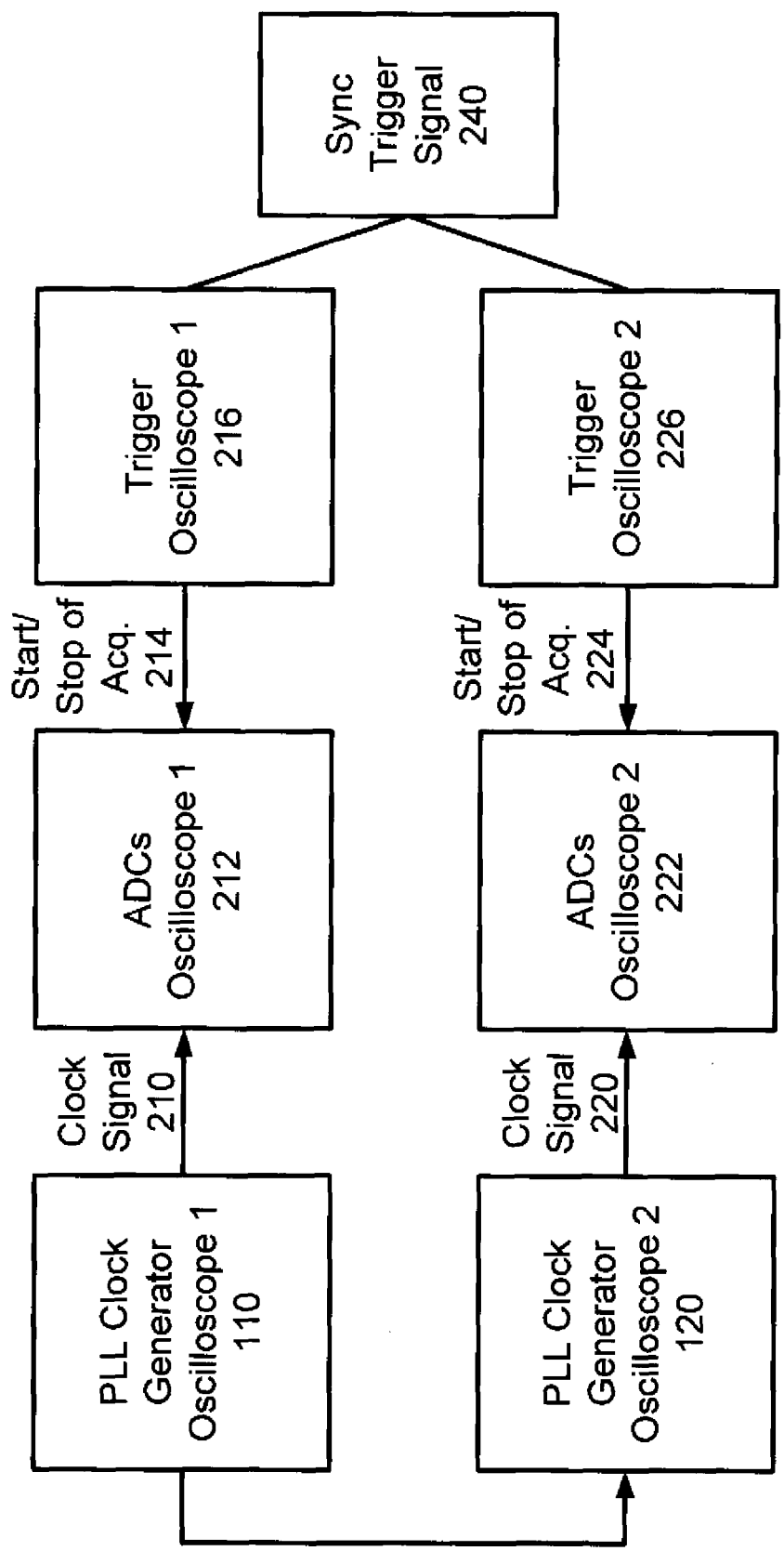
FIG. 2 is a block diagram depicting a system clocking and synchronization scheme in accordance with an embodiment of the invention.

Referring first to FIG. 2, the two PLL clock generators 110 and 120 are shown, and are connected as described above with respect to FIG. 1. As is further shown, a respective clock signal 210, 220 is provided from each of the PLL clock generator circuits 110, 120 to the corresponding Analog to Digital Converters (ADCs) 212, 222 in each of the oscilloscopes. However, in the embodiment of the invention, rather than trigger the oscilloscopes independently, or based upon the PLL generated clock signals that may drift relative to each other, an external synchronizing signal 240 is provided to an external trigger 216, 226 of each oscilloscope, thus producing start/stop of acquisition signals 214, 224. In this manner, a precise time when the trigger is generated can be determined between the two oscilloscopes. Thus, as will be described in greater detail below, by knowing the precise time stamp of the trigger, each oscilloscope can precisely determine the location of the signal of interest within the acquired record, and it is then possible to realign these acquired waveforms and precisely synchronize them. In order to allow for such synchronization, it is important that the time constant of any wander between the two PLLs be relatively small with respect to the length of the acquisition time for acquiring the signals. It has been determined that much of the PLL wander may be related to differential changes in temperature within the oscilloscopes. Since the thermal mass of any oscilloscope is large, the differential thermal time constant will likely meet the requirement.

Figure 3:
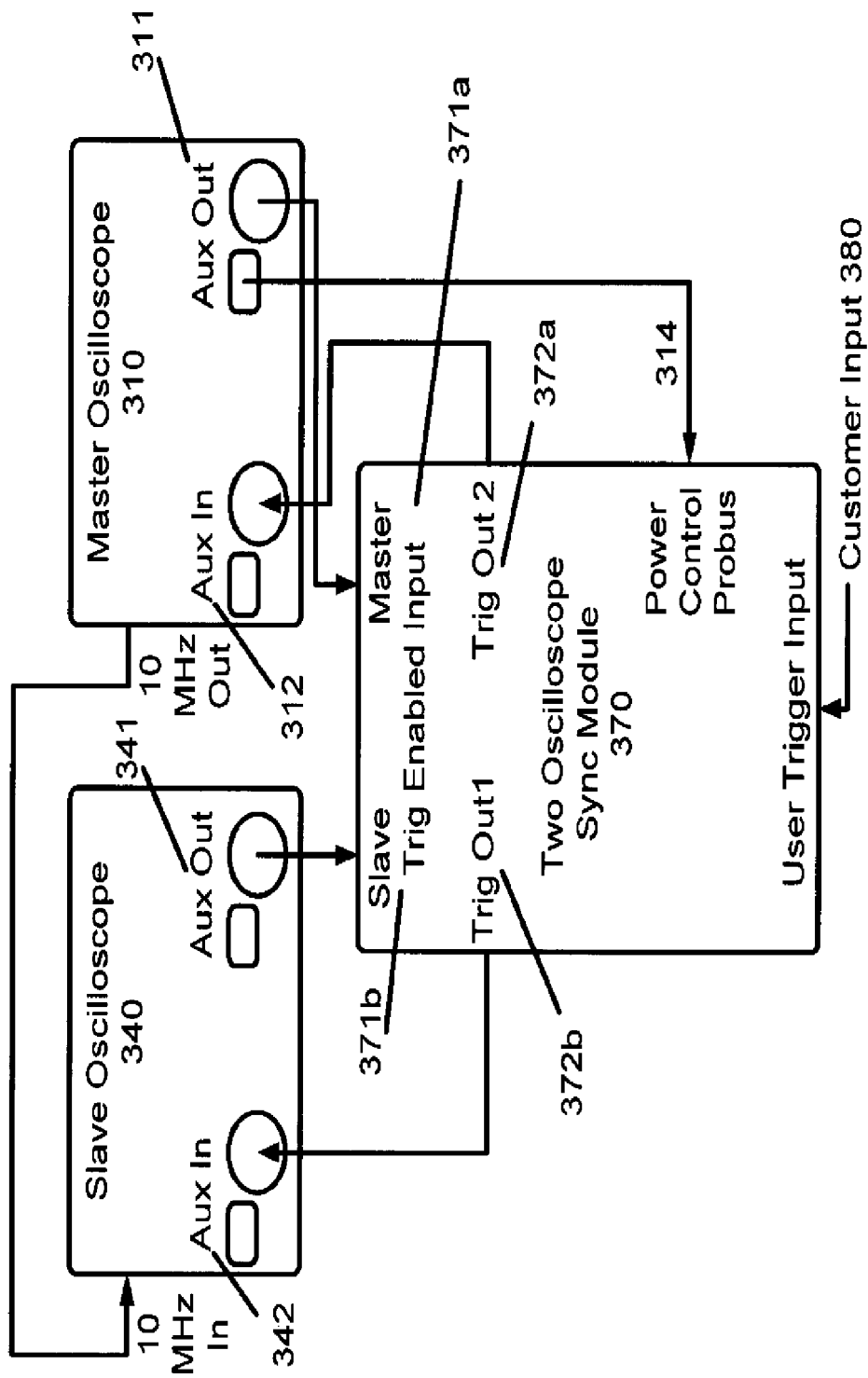
FIG. 3 is a system diagram depicting system connections in accordance with an embodiment of the invention.

Referring next to FIG. 3, a system diagram in accordance with an embodiment of the invention is shown. A master 310 and slave 340 oscilloscopes are shown. Also shown is a Two Scope Sync Module 370 constructed in accordance with an embodiment of the invention. A 10 MHz signal is output from the master oscilloscope to a 10 MHz input of the slave oscilloscope. Also shown an Aux out connector 311, 341 for each oscilloscope being connected to a corresponding trigger enabled input 371a, 371b on the Two Scope Synch Module 370 to indicate to the module when the master and slave oscilloscopes are ready to receive a trigger. An Aux In connector 312, 342 for each oscilloscope is connected to receive a common trigger signal from trigger out ports 372a, 372b of the Two Scope Sync Module 370. A control connector 314 is provided from the master oscilloscope 310 to the Two Scope Sync Module 370 for control thereof by the master oscilloscope. In the depicted example, a probus interface common to LeCroy® oscilloscopes is provided, but any other control scheme may be employed as is available on the oscilloscope and corresponding sync module. Finally, the Two Scope Sync Module 370 is able to receive a customer defined and provided input trigger signal 380.

As noted, the Two Scope Synchronization Module constructed in accordance with an embodiment of the invention may be adapted to receive three single inputs (in addition to the noted control connection), an output from a trigger (Aux) out of each of the two oscilloscopes to be synchronized (or more if more oscilloscopes are to be synchronized), and a user's trigger signal. The module then provides common and synchronous trigger signals to trigger the two (or more) oscilloscopes. These common trigger signals preferably will have a fast rise time, and more preferably have a rise time of approximately 100 ps or less and preferably a large enough amplitude of approximately ~800 mv pkpk or more, and they will therefore preferably and adequately drive the Aux Input of each oscilloscope, providing a synchronized trigger thereto.

This common trigger signal in conjunction with the master oscilloscope's external 10 MHz reference clock output driving the slave's oscilloscope external 10 MHz reference input may enable the two oscilloscopes to be synchronized with each other in frequency and phase to run as a master and slave system. In the absence of selection of an external customer input signal, the module may use a fixed frequency clock that may be generated internally in the module to trigger the Master and Slave oscilloscopes at a predefined interval or clock rate. A user is able to select between this signal and the input trigger signal using the master oscilloscope's user interface.

Figure 4:
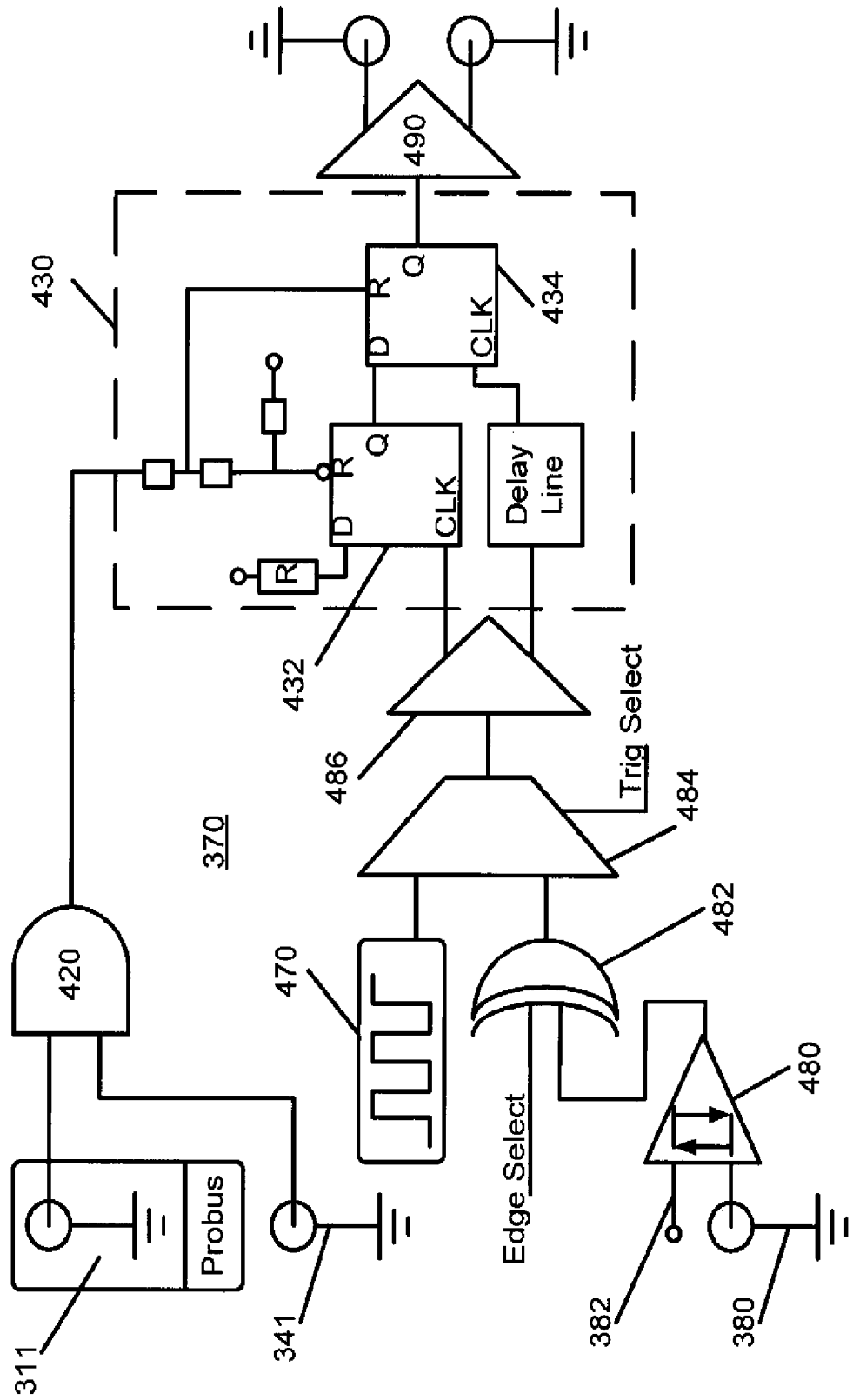
FIG. 4 is a block diagram depicting the functional operation of the apparatus for generating a common trigger in accordance with an embodiment of the invention.

Referring next to FIG. 4, a more detailed description of the Two Scope Sync Module 370 will now be provided. First a trigger enabled signal 311, 341 is received from each of the master and slave oscilloscopes 310, 340 to indicate the oscilloscopes are prepared to be triggered. These signals are inputs to an AND gate 420. The output of the AND gate is used to reset a Sync Block 430. These inputs are necessary for a synchronized trigger to occur and are used to detect when a trigger occurs in each oscilloscope. There are two selectable signals that a user can designate as a source of trigger in this system and method constructed in accordance with the invention. One of the signals is the user's trigger signal (Customer Input Signal) 380 and the other one is an internally generated square wave of fixed frequency 382. Thus, for use of the customer input trigger signal, the module contains a comparator 480 with a programmable threshold to accept the external customer trigger signal 380 with a relatively slow rise time and amplitude level that can preferably be varied over the range of ±4V, and may vary over different ranges based upon device design. The path for this customer input trigger then passes through an XOR gate 482 to detect the slope of the customer signal. The selection of this slope will enable either a positive or negative edge trigger. If the user selects such a Customer Input Signal 380 as source of trigger, then the oscilloscope trigger will be synchronized with the user signals. The user will then be able to run the oscilloscope in Auto, Normal, or single Acquisition Mode. This trigger mode is synchronous with the user's trigger input signal. If, however, the user selects a square wave generator 470 as the source of trigger, then the oscilloscope trigger will not be synchronized with the user signals, and as a result, acquisition will take place in a single acquisition mode. Note that even if the signal is not synchronous to the trigger, the oscilloscopes' waveforms are.

The user may select one of these two signals as the source of trigger through the application of a trigger select 484. Once the trigger source is selected it passes through a buffer 486 and then enters sync block 430. In sync block 430, the trigger provided from trigger select 484 is synchronized with the output of AND gate 420 as shown generally in FIG. 2. Sync Block 430 is a Meta stable hardened synchronization block, and it is used to synchronize the Trigger Enabled Signal (the output of AND gate 420) to the customer signal or to the internal square wave output from trigger select 484. Sync block uses two flip flops 432, 434. In this case the D input of the first flip flop 432 is tied high, and the Reset (R) inputs of both flip flops enable the clock to transmit the state of the D input to the output. This is different from more traditional industry standard synchronization methods which use the D input of the first flip flop as the signal input of the sync block 430. The Reset (R) input of each flip flop is defined by a signal indicating that both oscilloscopes are ready to accept a trigger from AND gate 420. As soon as the trigger condition is met, and the oscilloscopes are ready to accept a trigger, sync block 430 creates a signal that through a buffer 490 that will trigger the two oscilloscopes via the Aux Inputs 312, 342 thereof. The oscilloscopes, when triggered, will release the signals that generate the reset on sync block 430 which will automatically re-arm the devices. This method eliminates the need for the D input of the first flip flop to be time aligned with the Reset (R) input of each flip flop.

The output of the Sync Block is then buffered to generate two simultaneous trigger signals, TRIG OUT 1 and TRIG OUT 2. These outputs are synchronous, and nominally they have the same output level, rise time and delay to within some acceptable error. These two outputs are then connected to the external input of each oscilloscope (Aux In 312, 342 in FIG. 3), thus providing a common trigger to both oscilloscopes.

The delays of each channel of an oscilloscope are calibrated against the auxiliary input trigger. So if the trigger signals reach the oscilloscopes at the same time, the acquisition in both oscilloscopes will stop at the same time within some error. The next delay is described by the propagation delay in the sync module or the time elapsed from the accepted trigger condition to the signal reaching the auxiliary input. The last delay is described by the signal path differences between the cables connecting the oscilloscopes auxiliary inputs from the Sync module. A de-skew process is accomplished by injecting a fast rise time step in to the input of the Synchronization Module and into each channel of every oscilloscope. This allows measuring a delay difference between each channel of the oscilloscopes with respect to the trigger signal injected in the Synch Module. The assumption is that the user will use two identical (delay matched cables) to drive the Trigger Input of the Synch module and the input of the oscilloscope. This is preferable in order to define the delays explained above. One at a time, each channel may then be de-skewed by means of the de-skew function provided on the oscilloscope's user interface.

Upon operation, by receipt of a common, synchronized trigger, each oscilloscope can be certain when a particular period of time has passed. Thus, once the elapsed time is known, an acquired signal can be adjusted so that the edges of the acquired signals can be aligned with a known precise time period. Thus, in accordance with the invention it is possible to confirm that the signal has been acquired for the correct amount of time in both channels.

Figure 5:
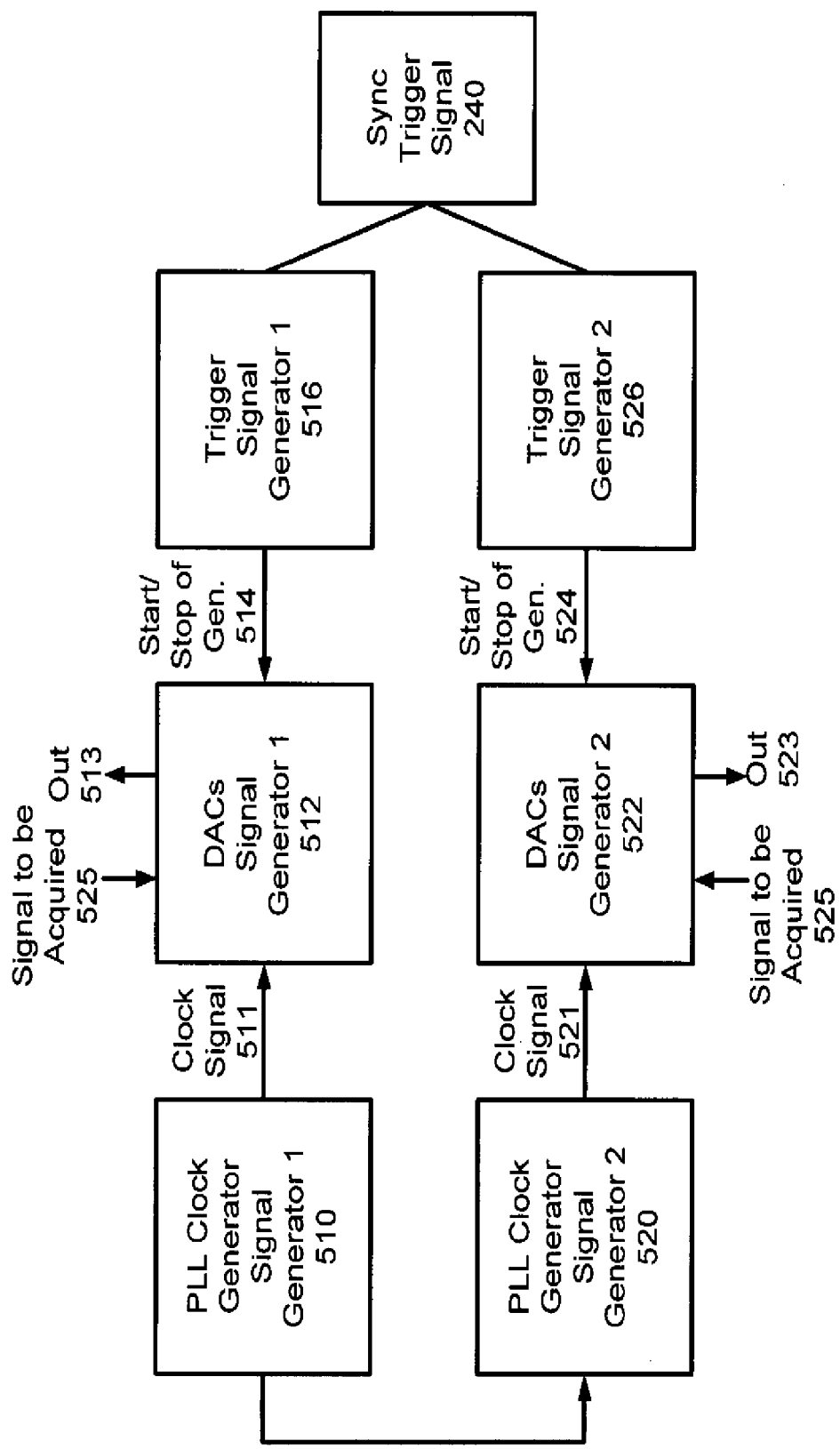
FIG. 5 is a block diagram depicting a system clocking and synchronization scheme applicable to two or more signal generators in accordance with an embodiment of the invention.

Application of the invention to an embodiment including the trigger of a plurality of signal generators will now be described making reference to FIG. 5. As is shown in FIG. 5, two PLL clock generators 510 and 520 are shown, and are connected as described above with respect to FIG. 1. As is further shown, a respective clock signal 511, 521 is provided from each of the PLL clock generator circuits 510, 520 to the corresponding Digital to Analog Converters (DACs) 512, 522 in each of the signal generators. However, in the embodiment of the invention, rather than trigger the signal generators independently, or based upon the PLL generated clock signals that may drift relative to each other, an external synchronizing signal 240 is provided to an external trigger 516, 526 of each signal generators, thus producing start/stop of generation signals 514, 524. In this manner, a precise time when the trigger is generated can be determined between the two signal generators and used to generate a synchronized output signal 513, 523. In order to allow for such synchronization, it is important that the time constant of any wander between the two PLLs be relatively small with respect to the length of the generation time for generating the signals. It has been determined that much of the PLL wander may be related to differential changes in temperature within the signal generator. Since the thermal mass of any signal generator is large, the differential thermal time constant will likely meet the requirement.

While this method and apparatus will nominally synchronize these separately acquired signals from two different oscilloscopes or signals generated from two different generators, there may still be two sources of error. 1) Trigger jitter of the slave oscilloscope or generator may make any waveforms coming from the slave instrument jittery with respect to the master. It has, however, been determined that such jitter may be extremely small, or the order of below 2 ps, relative to the timing of the signal and therefore will not affect the synchronization described above. 2) Clock jitter. Although the reference clock is the same for the two instruments, and therefore the signals should be coherent, any VCO noise in the 2 PLLs may be different, so some clock jitter may be added to the signals from this source. Once again, however, the total clock jitter has been measured at about 150 fs so this effect would be a fraction of the clock jitter, therefore not very significant compared to the 2 ps related to trigger jitter.

While the invention has been described applicable to oscilloscopes, the invention is intended to be equally applicable to other test and measurement apparatuses and to electronic apparatuses in general. Furthermore, while the synchronization of two apparatuses has been described, it is contemplated that the method and apparatus of the invention may be expanded to provide synchronization to any number of test and measurement apparatuses. Furthermore, the invention may be used in any number of signal generation apparatuses to properly synchronize therebetween.

It will thus be seen that the objects set forth above, among those made apparent from the preceding description, are efficiently attained and, since certain changes may be made in the above construction(s) without departing from the spirit and scope of the invention, it is intended that all matter contained in the above description or shown in the accompanying drawing(s) shall be interpreted as illustrative and not in a limiting sense.

It is also to be understood that the following claims are intended to cover all of the generic and specific features of the invention herein described and all statements of the scope of the invention which, as a matter of language, might be said to fall there between.

What is claimed:

1. A method for synchronizing an acquisition from a plurality of test and measurement apparatuses, comprising the steps of:
    synchronizing a phase locked loop clock generator in each of the plurality of test and measurement apparatuses;
    sampling an input wave form at each of the plurality of test and measurement apparatuses by an analog to digital converter in accordance with the generated phased locked loop clock;
    providing a synchronized trigger signal to a trigger input of each of the plurality of test and measurement apparatuses;
    triggering each of the plurality of test and measurement apparatuses in accordance with the synchronized trigger signal to acquire a waveform; and
    adjusting the acquired waveform in one or more of the plurality of test and measurement apparatuses in accordance with the time stamp provided by synchronized trigger.

2. The method of claim 1, wherein the step of providing the synchronized trigger signal further comprises the steps of:
    providing a data signal to a reset input of a first flip flop chip, the data input of the first flip flop being tied to a predetermined binary high value,
    providing an signal output from the first flip flop to a data input of a second flip flop chip, the data signal being provided to a reset input of the second flip flop;
    providing a trigger signal to a clock input of the first flip flop chip;
    providing the trigger signal, via a delay element, to a clock input of the second flip flop.

3. The method of claim 2, wherein the trigger signal comprises an internally generated signal.

4. The method of claim 2, wherein the trigger signal comprises an externally provided trigger signal.

5. The method of claim 2, further comprising the step of outputting a synchronized trigger signal from an output of the second flip flop.

6. The method of claim 2, wherein the data signal is received from an AND gate.

7. The method of claim 6, wherein the inputs to the AND gate comprise two or more trigger enabled signals from two or more corresponding test and measurement apparatuses.

8. A synchronization apparatus for synchronizing a plurality of test and measurement apparatuses, comprising:
- a trigger selector for selecting from a plurality of triggers to be provided to the plurality of test and measurement apparatuses;
- a trigger enabled input for receiving a trigger enabled signal from each of the plurality of test and measurement apparatuses;
- a synchronizing element for generating a single synchronized trigger synchronized with the selected trigger and the trigger enabled inputs;
- a plurality of trigger outputs for providing the synchronized trigger to a trigger input of each of the plurality of test and measurement apparatuses to ensure synchronization thereof; and
- an adjustment element for adjusting an acquired waveform in one or more of the plurality of test and measurement apparatuses in accordance with a time stamp provided by synchronized trigger.

9. The apparatus of claim 8, wherein the synchronizing element further comprises:
- a first flip flop receiving a data signal to a reset input thereof, and having its data input tied to a predetermined binary high value,
- a second flip flop receiving a signal output from the first flip flop to a data input thereof, the data signal being provided to a reset input of the second flip flop;
- a trigger signal provided to a clock input of the first flip flop chip, and provided to a clock input of the second flip flop via a delay element.

10. The system of claim 9, further comprising an edge select to determine an edge direction of the externally supplied trigger signal.

11. The system of claim 9, wherein the test and measurement apparatuses are oscilloscopes.

12. The apparatus of claim 9, wherein the trigger signal comprises an internally generated signal.

13. The apparatus of claim 9, wherein the trigger signal comprises an externally provided clock signal.

14. The apparatus of claim 9, wherein a synchronized trigger signal is provided from an output of the second flip flop.

15. The apparatus of claim 9, wherein the data signal is received from an AND gate.

16. The apparatus of claim 15, wherein the inputs to the AND gate comprise two or more trigger enable signals from two or more corresponding test and measurement apparatuses.

* * * * *